(12) United States Patent
Prasad et al.

(10) Patent No.: US 11,055,463 B1
(45) Date of Patent: Jul. 6, 2021

(54) SYSTEMS AND METHODS FOR GATE ARRAY WITH PARTIAL COMMON INPUTS

(71) Applicant: Taiwan Semiconductor Manufacturing Company Limited, Hsinchu (TW)

(72) Inventors: Guru Prasad, Austin, TX (US); Osamu Takahashi, Williamson County, TX (US); Yu Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/836,998

(22) Filed: Apr. 1, 2020

(51) Int. Cl.
*G06F 30/373* (2020.01)
*G06F 30/38* (2020.01)
*G06F 30/327* (2020.01)

(52) U.S. Cl.
CPC .......... *G06F 30/373* (2020.01); *G06F 30/327* (2020.01); *G06F 30/38* (2020.01)

(58) Field of Classification Search
CPC ...... G06F 30/373; G06F 30/327; G06F 30/38; G06F 2119/16; G06F 2119/00
See application file for complete search history.

(56) References Cited

U.S. PATENT DOCUMENTS

| | | | | |
|---|---|---|---|---|
| 5,165,054 A * | 11/1992 | Platt | ...................... | H03F 3/3001 330/277 |
| 6,329,845 B1 * | 12/2001 | Taki | .................... | H01L 27/0207 257/E27.062 |
| 8,357,955 B2 * | 1/2013 | Tanaka | ................ | H01L 27/0207 257/206 |
| 10,586,809 B2 * | 3/2020 | Kang | ................ | H01L 27/11807 |
| 2002/0000835 A1 * | 1/2002 | Sasaki | ................... | G06F 30/327 326/113 |
| 2003/0016055 A1 * | 1/2003 | Oodaira | ................ | G06F 30/327 326/81 |
| 2004/0130349 A1 * | 7/2004 | Morgenshtein | .... | H03K 19/0948 326/112 |
| 2010/0058298 A1 * | 3/2010 | Markov | ..................... | G06F 8/65 717/128 |
| 2013/0002303 A1 * | 1/2013 | Viau | .................. | H03K 19/0948 326/121 |
| 2014/0075401 A1 * | 3/2014 | Seningen | ................ | G06F 30/39 716/106 |

(Continued)

*Primary Examiner* — Nha T Nguyen

(74) *Attorney, Agent, or Firm* — Jones Day

(57) ABSTRACT

Systems and method are provided for automating design of an integrated circuit. In an embodiment, an integrated circuit design file is received that specifies logic elements. A plurality logic elements are identified that share a common input signal. A determination is made that the each of plurality of logic elements include a series of transistors. Upon said determining, the integrated circuit design is modified by identifying first and second transistors for a first of the logic elements, identifying first and second transistors for a second of the logic elements, deleting the second transistor of the second logic element, and routing an output of the first transistor of the second logic element to an input of the second transistor of the first logic element. The modified integrated circuit design is stored in a non-transitory computer-readable medium.

20 Claims, 12 Drawing Sheets

(56) References Cited

U.S. PATENT DOCUMENTS

2015/0178427 A1* 6/2015 Agarwal ............. G06F 30/3312
                                                    716/108
2017/0213847 A1* 7/2017 Nebesnyi .......... H01L 27/11807
2017/0317100 A1* 11/2017 Kang ................ H01L 27/11807

* cited by examiner

US 11,055,463 B1

SYSTEMS AND METHODS FOR GATE ARRAY WITH PARTIAL COMMON INPUTS

BACKGROUND

Electronic Design Automation (EDA) and related tools enable efficient design of complex integrated circuits which may have extremely large numbers of components (e.g., thousands, millions, billions, or more). Specifying characteristics and placement of all of those components (e.g., transistor arrangements to implement desired logic, types of transistors, signal routing) by hand would be extremely time consuming and expensive for modern integrated circuits, if not impossible. Modern EDA tools utilize cells to facilitate circuit design at different levels of abstraction. A cell in the context of EDA is an abstract representation of a component within a schematic diagram or physical layout of an electronic circuit in software. Circuits may be designed at a logical layer of abstraction using cells, where those circuits may then be implemented using lower level specifications (e.g., transistor arrangement, signal routing) associated with those cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
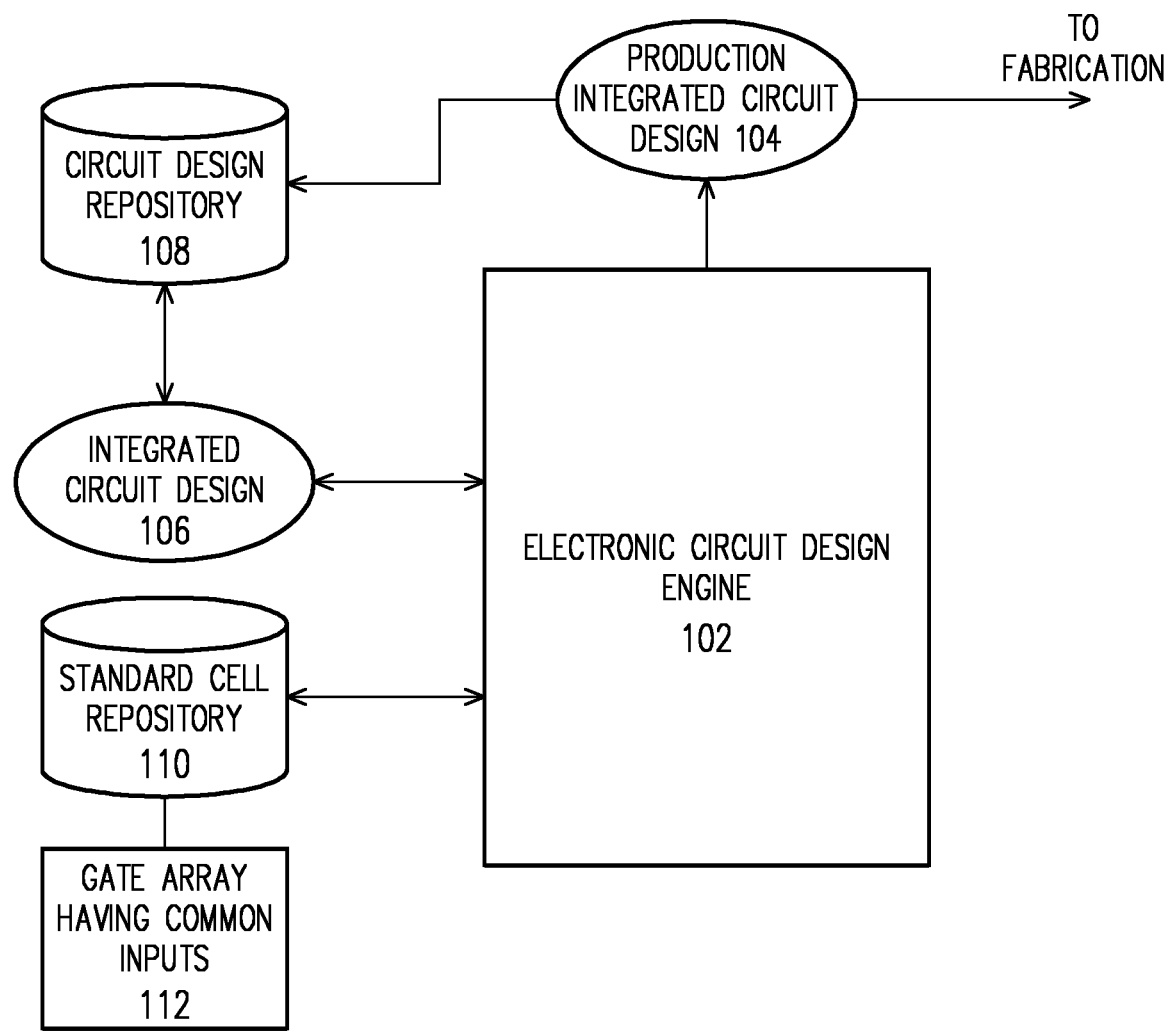
FIG. 1 is a block diagram depicting an electronic circuit design engine according to an exemplary embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Circuit is a complex network of a very large number of components (e.g., transistors, resistors, capacitor) interconnected using the features of a process technology to realize a desired function. Manually design such a component is typically not feasible because of the number of steps involved and the amount of design information that needs to be processed. EDA tools may be used to assist the designers in this process. Due to the size and complex nature of the design process, the integrated circuit may be designed using a hierarchical approach where the design is broken down in smaller pieces which are assembled to form the complete chip. This process also helps in pre-designing commonly used sub-blocks and reusing them where needed. A standard cell library is one such collection of basic components (e.g., AND, OR, NAND, NOR, XOR, Flip-flops, Latches) that is commonly used by certain EDA tools to automate the generation of layout from a behavioral description of a block. Each piece of design may have an abstract representation for the various information that is needed to capture the design such as functional behavior, circuit description, physical layout, timing behavior, many of which are used by the EDA tools to assist in the design process.

EDA tools may include a library of standard cells associated with common circuit functions. For example, standard cells can be associated with logic gates, such as an AND gate, an OR gate, an XOR gate, a NOT gate, a NAND gate, a NOR gate, and an XNOR gate, and circuits such as a multiplexer, a flip-flop, an adder, and a counter. Those standard cells can be arranged to realize more complex integrated circuit functions. When designing an integrated circuit having specific functions, standard cells may be selected. Next, designers, or EDA software, or ECAD (Electronic Computer-Aided Design) tools draw out design layouts of the integrated circuit including the selected standard cells and/or non-standard cells. The design layouts may be converted to photomasks. Then, semiconductor integrated circuits can be manufactured, when patterns of various layers, defined by the photomasks, are transferred to a substrate.

FIG. 1 is a block diagram depicting an electronic circuit design engine according to an exemplary embodiment. The electronic circuit design engine 102 facilitates development of a production integrated circuit design 104 that is used in the fabrication of a physical integrated circuit. The circuit design engine 102 receives or facilitates initial generation of an integrated circuit design 106 that may be developed (e.g., over a number of iterative revisions) and stored in a non-transitory circuit design repository 108, such as via interactions with a user interface or execution of automated scripts. For example, on request, the circuit design engine 102 may access or receive the integrated circuit design 106 in the form of a computer file, perform operations on the integrated circuit design 106, and then output a modified form of the design (e.g., as an integrated circuit design 106 file for storage in the design repository 108 or as a production integrated circuit design 104 (e.g., in the form of an EDA file, a netlist) for fabrication). The circuit design 106 may be made up of a plurality of components (e.g., resistors, capacitors, transistors, logic gates, data signal lines), some or all of which take the form of cells. The circuit design engine 102 is responsive to one or more cell repositories (e.g., standard cell repository 110) that store data associated with standard cells that can be used as building blocks in the generation of integrated circuit designs 104, 106. Standard cells may take a variety of forms and represent a variety of functions (e.g., the operation of one or more logic gates), such as a gate array for gates having one or more common inputs as depicted at 112.

Figure 2:
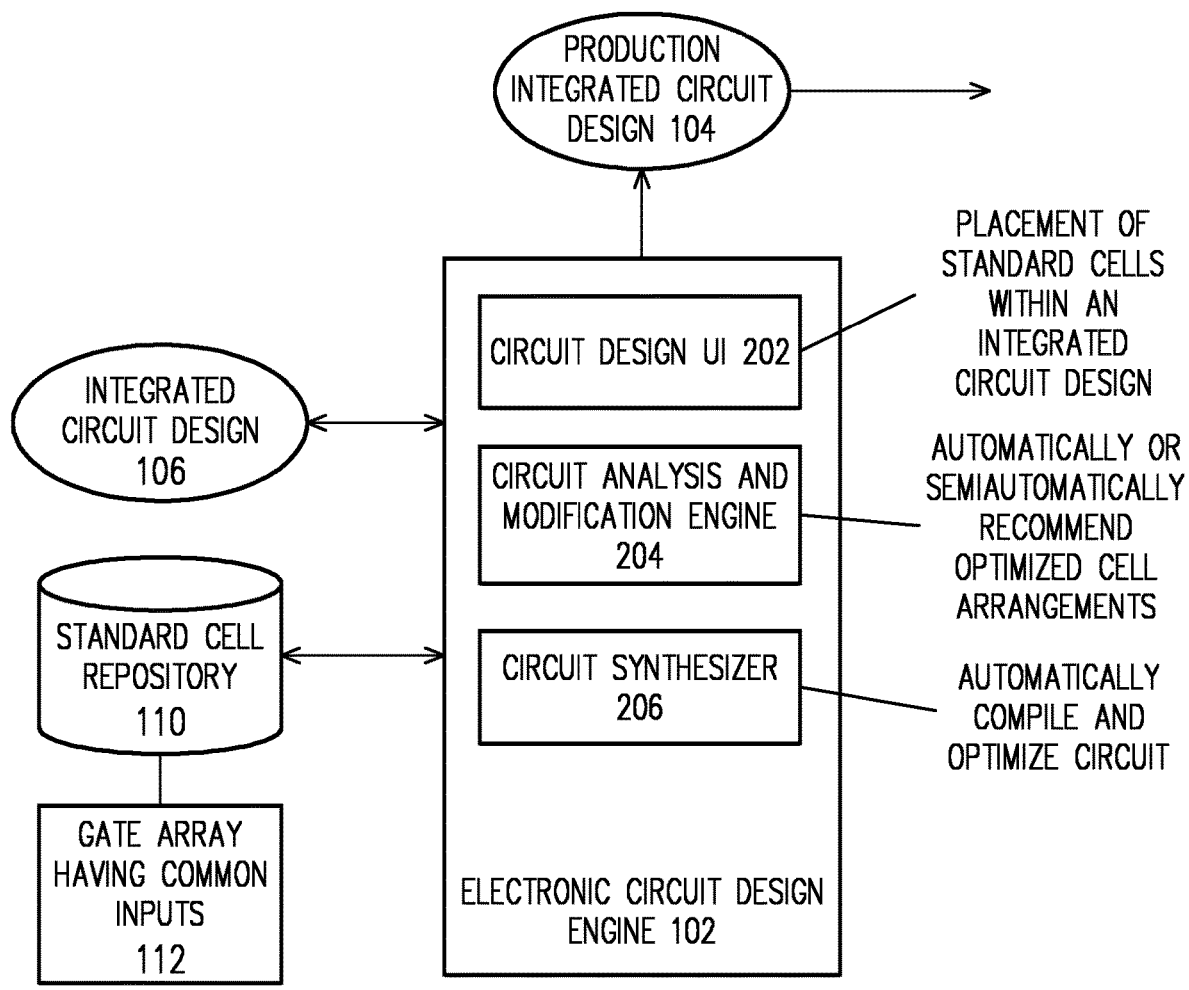
FIG. 2 is a block diagram depicting modules of a circuit design engine according to an exemplary embodiment.

Electronic circuit design engines may provide a variety of different circuit design functionality. FIG. 2 is a block diagram depicting modules of a circuit design engine according to an exemplary embodiment. An electronic circuit design engine 102 receives an integrated circuit design 106 via a file or commands that dictate the content of that design 106 entered via a mechanism such as a circuit design user interface 202. The interface 202 may display graphics or text describing an integrated circuit design and provide commands for building and manipulating the design. The circuit design engine 102 is further responsive to a standard cell repository 110 that stores standard cell data records like the one depicted at 112. The circuit design user interface 202 can provide controls for accessing standard cells from the repository 110 and integrating them into an integrated circuit design 106. Upon completion of an integrated circuit design 106, the design may be output from the engine 102 at 106 for saving in a non-transitory computer readable medium or as a production integrated circuit design 104 for fabrication of an integrated circuit.

Figure 3:
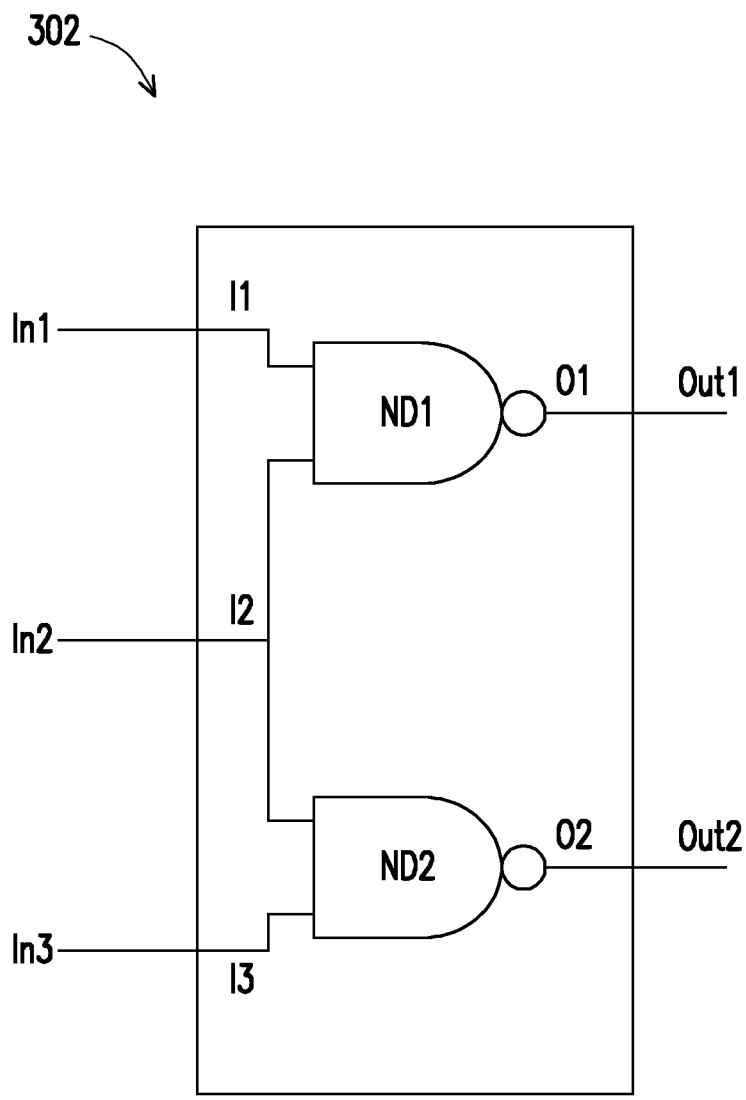
FIG. 3 depicts a logic representation of an example of a standard cell gate array with partial common inputs in accordance with an embodiment.

FIG. 3 depicts a logic representation of a standard cell gate array with partial common inputs in accordance with an embodiment. The standard cell 302 includes three data inputs In1, In2, and In3, and provides two outputs Out1, Out2. The standard cell 302 logic includes two not-AND (NAND) gates, where In1 and In2 are received by a first NAND gate ND1, and In2 and In3 are received by a second NAND gate ND2. Each NAND gate ND1, ND2 is configured to output a logic high level in all cases except where both of its inputs are at logic high levels (e.g., ND1 outputs logic high when In1, In2, or both In1 and In2 are at logic low levels). Note that the two NAND gates of the standard cell 302 both receive a common input In2. As described further herein, implementing two gates having one or more common inputs, like the NAND gates of standard cell 302, as a standard cell may have advantages over implanting those gates using two separate standard cells (e.g., a separate standard cell for each of the NAND gates).

Because standard cells are designed with frequent reuse in mind, more effort may be put into their optimization over a one-off circuit synthesis. Full circuit timing simulation may be used to validate timing within the standard cell, ensuring accuracy and enabling more aggressive designs. For example, transistors of a particular size in a particular arrangement with optimized routing may be selected within a standard cell to maximize power efficiency and speed.

Standard cells generally use lower conducting layers of a process technology to establish connections between the various components. These lower layers generally come with complicated DRC rules that is not well comprehended by CAD tools. Since standard cell layouts are typically drawn with human involvement, lower conducting layers of the process technology are typically used. One benefit, in embodiments, of the present disclosure (e.g., over implementing the same logic using discrete logic gate cells) is that more connections may be established using lower conducting layers resulting in denser designs.

Figure 4:
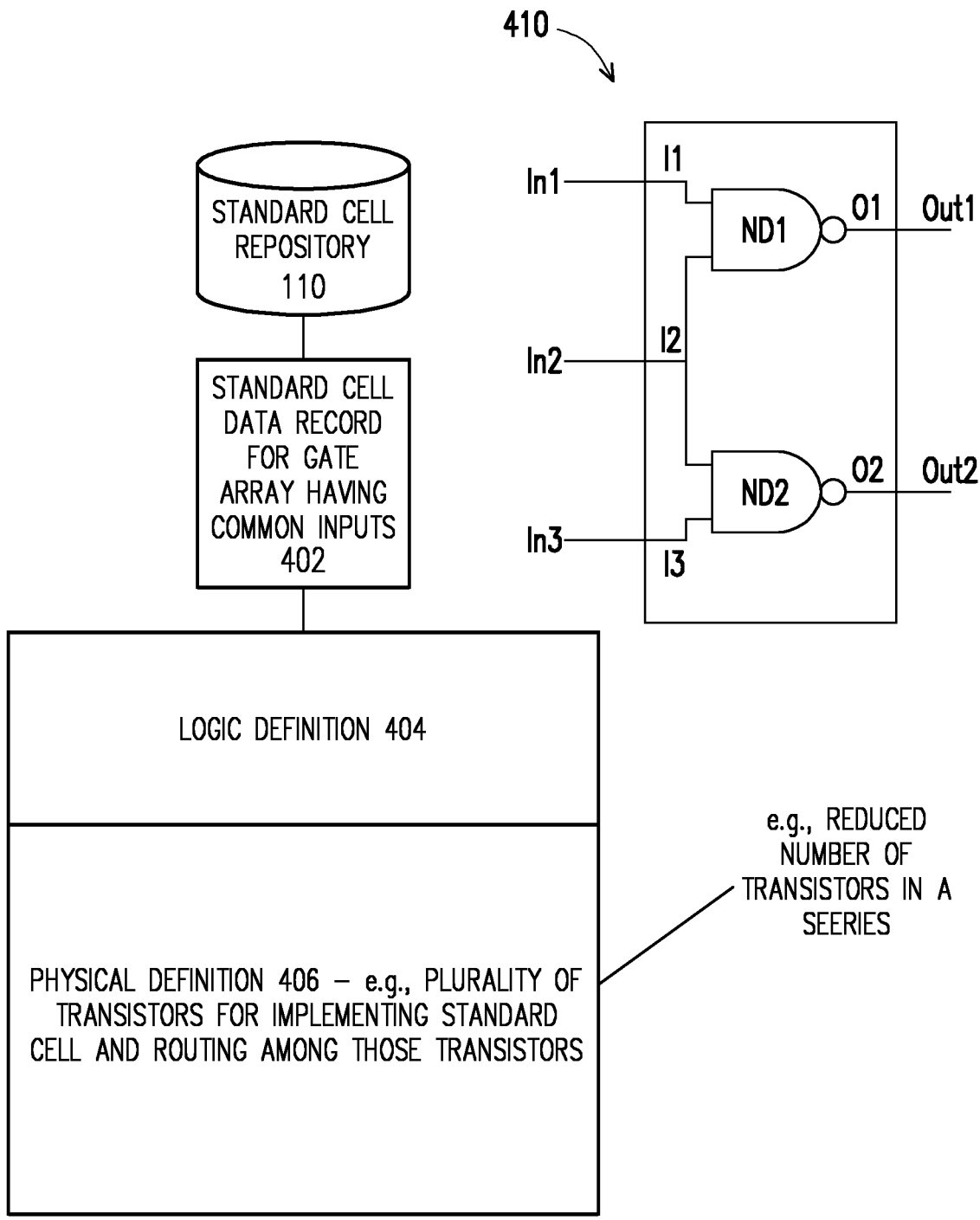
FIG. 4 is a diagram depicting a standard cell data record in accordance with embodiments of the disclosure.

FIG. 4 is a diagram depicting a standard cell data record in accordance with embodiments of the disclosure. A standard cell repository 110 includes a plurality of data records 402, each being associated with a standard cell, such as gate arrays having gates with a common input(s) as described herein. A standard cell data record 402 can store and provide a variety of data, which may be stored in fields of the data record. For example, the data record 402 may include a logic definition 404 of the standard cell that describes the logical operation of that standard cell within an integrated circuit design. Logic of a standard cell may take a variety of forms (e.g., an array of gates, some of which share a common input (In2), as shown at 410). The logic definition 404 may describe the standard cell inputs (e.g., number, type, signal format (e.g., single ended, differential)), its logical operation (e.g., providing three data input signals to two NAND gates to produce two output signals), and outputs of the standard cell. The data record 402 may also include a physical definition 406 of hardware (e.g., transistors, signal routing among the transistors) for implementing the logic identified in the logic definition 404. In embodiments, a data record associated with a standard cell may include an identification of a logic function, a netlist, a schematic, a layout, timing information, as well as other data.

With reference back to FIG. 2, the electronic design engine 102 may further include a circuit analysis and modification engine 204 that may operate alone or in concert with the circuit design user interface 202 to modify (e.g., improve, optimize) an integrated circuit design. For example, the circuit analysis and modification engine 204 may review an integrated circuit design 106 and identify portions of that design 106 that may be suboptimal. For example, where functionality implemented via multiple cells is present in the design 106 that could be implemented by a single standard cell from the repository 110, the circuit analysis and modification engine 204 may suggest replacement of the identified replaceable portion of the design 106 with a standard cell (e.g., in a semi-automatic method where that engine 204 iteratively identifies possible modifications and requests user instructions on whether to make the modification). Or in some implementations, the circuit analysis and modification engine 204 may be configured to automatically modify the circuit design 106 to substitute the standard cell for the replaceable portion.

Figure 5:
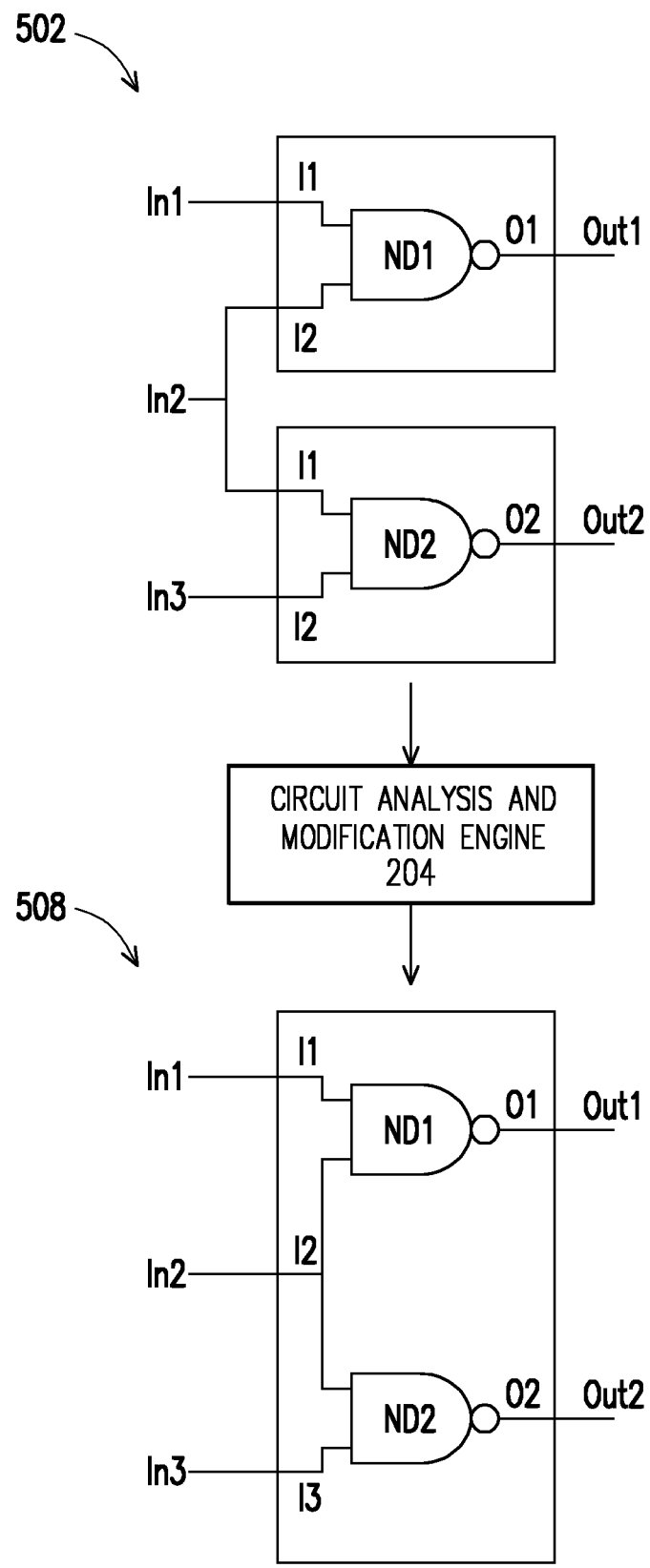
FIG. 5 is a diagram depicting example operation of a circuit analysis and modification engine in an embodiment.

FIG. 5 is a diagram depicting example operation of a circuit analysis and modification engine in an embodiment. A current version of a portion of an integrated circuit design is illustrated at 502. That portion includes two NAND gates ND1, ND2. ND1 receives inputs In1 and In2 to produce output Out1. ND2 receives inputs In2, In3 to produce Out2. Both ND1, ND2 receive input In2.

The circuit analysis and modification engine 204 analyzes a current version of the integrated circuit design 502 and provides automated circuit modifications (e.g., optimizations) or presents options for circuit modifications to a designer. For example, upon receiving the portion of the integrated circuit design depicted at 502, the circuit analysis and modification engine 204 determines that the standard cell at 508 may provide improved performance in implementing the same logic, for example based on the two logic gates ND1, ND2 receiving a common input signal In2. The standard cell at 508 utilizes two NAND gates ND1, ND2 that are optimized in implementation based on their receipt of common input signal In2.

Use of a single standard cell, as suggested by the circuit analysis and modification engine 204 in FIG. 5, can produce an integrated circuit with improved design (e.g., from one or more of a performance, power, area perspective). Thus the circuit analysis and modification engine 204 may seek to minimize a total number of cells/standard cells in an integrated circuit design and/or the total number of pins that must be routed between blocks as part of its automated/semi-automated circuit modification.

With reference back to FIG. 2, the design engine 102 may further include a circuit synthesizer 206 that converts the integrated circuit design 106, which may be stored at a high level of abstraction (e.g., where cells and logic are represented by their function rather than underlying physical (e.g., transistor) implementation). For example, the logical behavior of an integrated circuit may be generally captured by a software representation in a high level design language such as VHDL, Verilog, CAD. A circuit synthesizer 206 may read such a high level description and refer to a library of standard cells and other macros (e.g., memories, analog components) to synthesize a circuit that implements the functionality. Using systems and methods described herein, a circuit synthesizer 206 can identify instances of multiple gates sharing a common input and map those instances to a standard cell that can provide equivalent functionality. The circuit synthesizer may further convert a high level representation to a lower level of detail (e.g., converting flip flops to their component master and slave latches, converting to a netlist (e.g., a list of electronic components in a circuit and a list of the nodes they are connected to)). In performing that conversion, the synthesizer may modify the circuit design 106 (e.g., optimize) to produce a modified design, such as a production integrated circuit design 104 for fabricating an integrated circuit.

Figure 6:
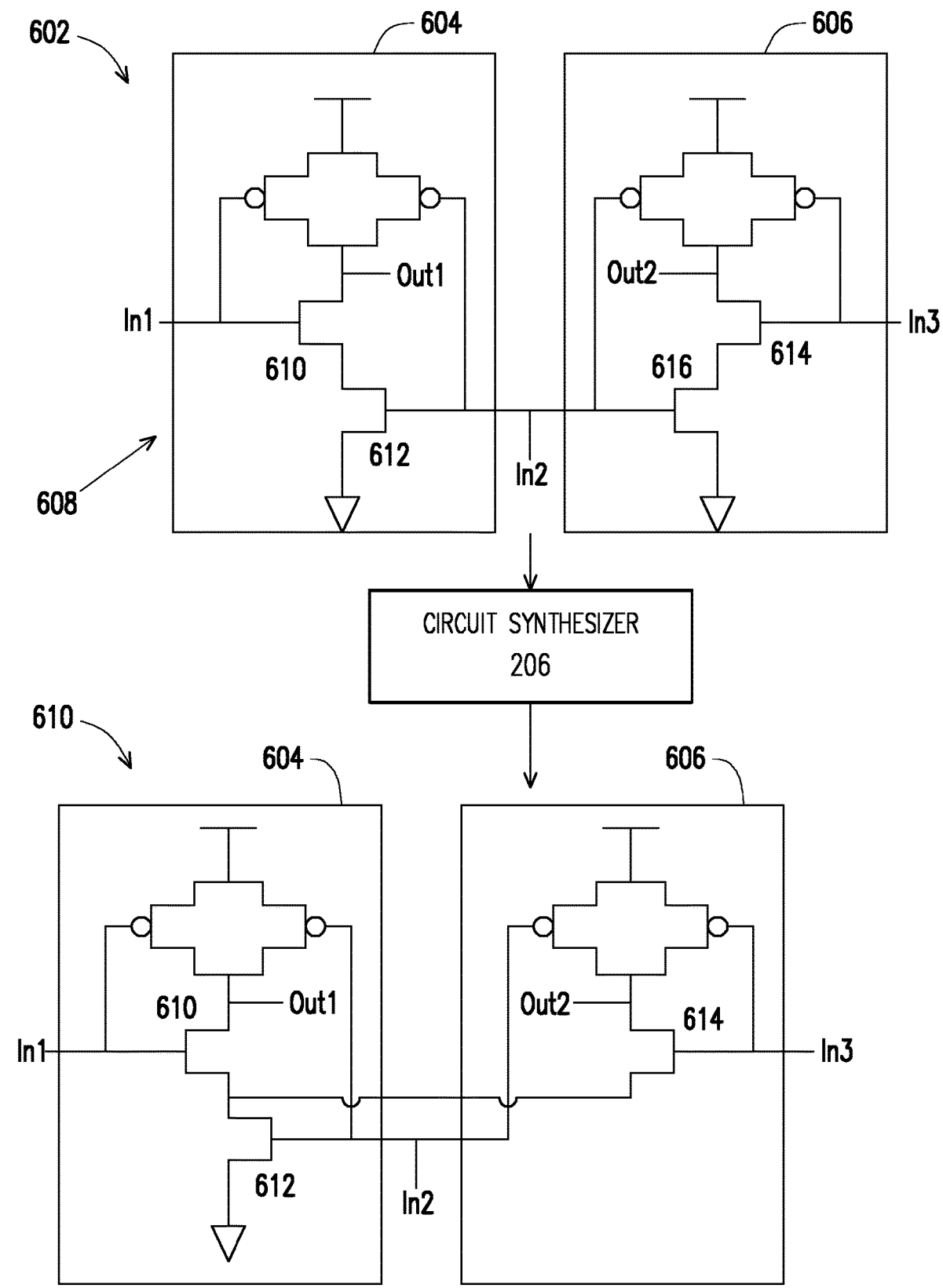
FIG. 6 is a diagram depicting a circuit synthesizer modifying an integrated circuit design in an embodiment of the disclosure.

For example, the circuit synthesizer 206 may modify an integrated circuit design to reduce the number of components in a design to increase power efficiency, reduce area, and/or increase circuit speed performance. FIG. 6 is a diagram depicting a circuit synthesizer modifying an integrated circuit design in an embodiment of the disclosure. The circuit synthesizer 206 receives all or a portion of an integrated circuit design at 602. The design illustrated at 602 is shown at a transistor level of detail, but could be received at a cell level of detail (e.g., as two NAND standard cells as depicted at 502 in FIG. 5). That design 602 includes transistors for two NAND gates 604, 606 that commonly receive an input signal In2. Each NAND gate in this design 602 is includes two PMOS transistors that enable current flow from a source node to an output node (e.g., Out1, Out2) when either of its inputs are at a low logic level. Each NAND gate includes a stack of two NMOS transistors (e.g., at 608) that bring the output node to a low logic level when both of the NAND gate inputs are at a high logic level. Particularly, the first NAND gate logic element 604 includes a first 610 and second 612 transistor of its series of transistors, and the second NAND gate logic element 606 includes a first 614 and second 616 transistor of its series of transistors. Specifically, Out1 is pulled low via transistors 610, 612 when In1 and In2 are high, and Out2 is pulled low via transistors 614, 616 when In2 and In3 are high.

The circuit synthesizer 206 proposes or automatically makes a modification to the circuit to reduce the transistor count and, in many cases, area and power consumption of the two NAND gates 604, 606. Specifically, where two logic gates include a stack of transistors in series (e.g., the stack of NMOS transistors 610, 612 configured to pull Out1 low when both In1 and In2 are high; a stack of PMOS transistors; a stack of NMOS and PMOS transistors), it may be possible to remove one of the transistors from one of the gates to simplify the design. As shown at 610, the circuit synthesizer 206 deletes the second transistor 616 of the second NAND logic element 606 and routes and drain of the first transistor 614 to a source of the second transistor 612 of the first NAND logic element 604. The number of transistors across the two NAND gates 604, 606 is reduced by one, but the function remains substantially identical. Specifically, Out1 is pulled low via transistors 610, 612 when In1 and In2 are high, and Out2 is pulled low via transistors 614, 612 when In2 and In3 are high.

The circuit synthesizer 206 may identify opportunities for modification like the one depicted in FIG. 6 in a variety of ways. For example, it may perform a search of an integrated design for portions having stacks of serially connected transistors that are controlled by input signals that include a common input signal. The circuit synthesizer 206 may also search for cells controlled by common input signals that are known to contain such serially connected transistor stacks. The circuit synthesizer 206 may also perform modifications of an integrated circuit design to try to create more opportunities for optimization. For example, with reference to the integrated circuit design at 602, while circuit modification that deletes a transistor is possible when transistor 616 is controlled by the common signal In2, that modification may not be possible where the transistor controlled by the common signal is connected to the output node (e.g., where common signal In2 is controlling transistor 614 that is connected to output node 614). But NAND logic elements are symmetrical logic elements. Such symmetrical logic elements function the same even when the terminals to which their inputs are connected are switched (e.g., NAND gate 606 functions the same when In2 is connected to 616 with In3 connected to 614; and when In2 is connected to 614 while In3 is connected to 616). Thus the circuit synthesizer 206 can identify more integrated circuit topologies that are candidates for modification (e.g., instances of gates transistors stacked in series having transistors controlled by a common signal, where the transistors controlled by the common signal are not connected to an output node) by changing (e.g., swapping, rotating) the inputs to a symmetric gate to see if there is an arrangement of inputs that meets the modification criteria.

Figure 7:
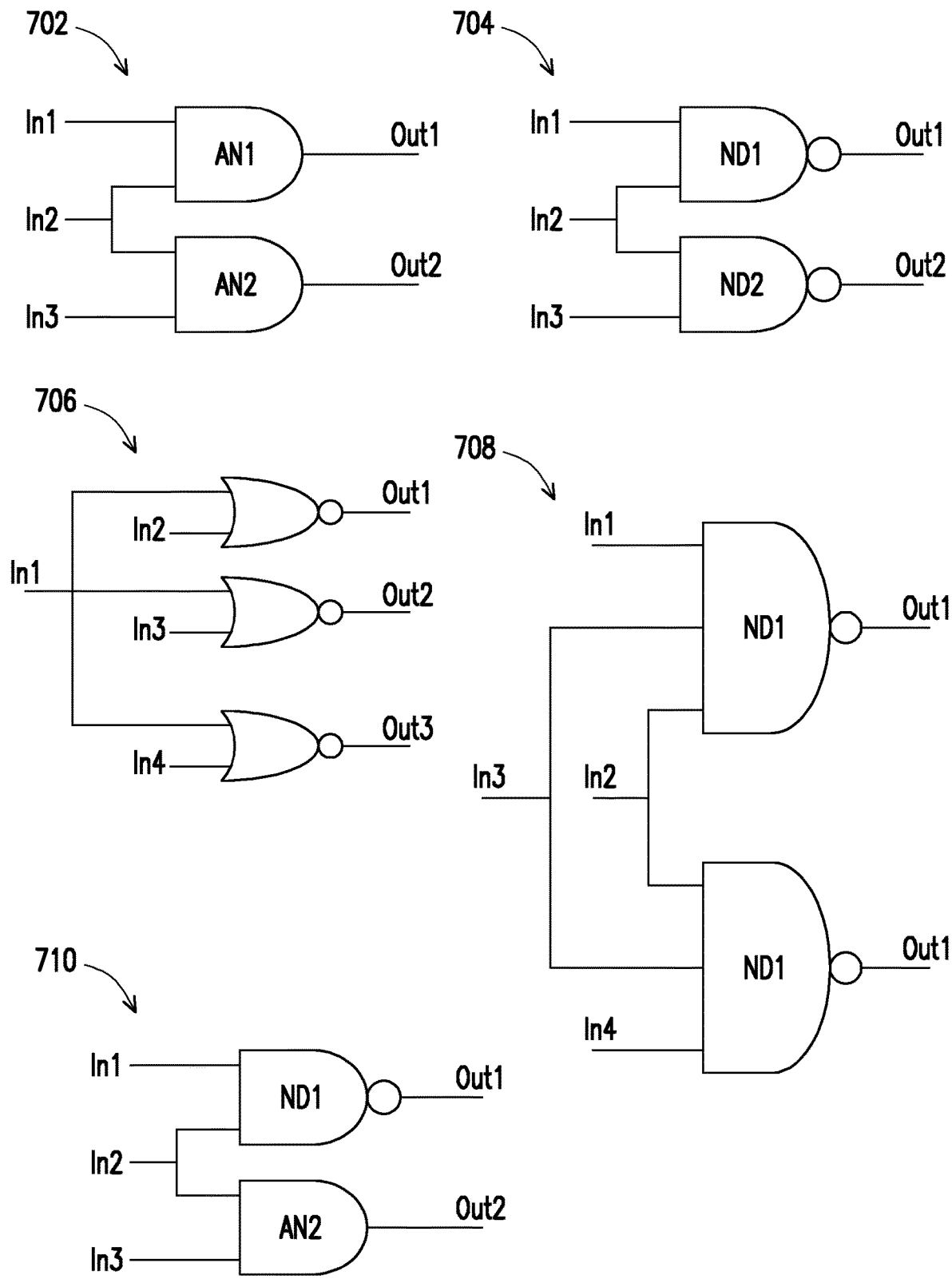
FIG. 7 is a diagram depicting examples of candidates for standard cell implementation of circuit modification in accordance with embodiments of the disclosure.

As noted above, common input gate cell arrangements that may be candidates for implementation as a standard cell or for circuit modification techniques described herein may take a variety of forms. FIG. 7 is a diagram depicting example candidates. Standard cell implementation and/or circuit modification may be implemented for two AND gates having a common input In2 as depicted at 702. A pair of NAND gates having a common input In2 may also be a candidate as depicted at 704. A common input gate array and/or circuit modification may be appropriate for more than two gates as depicted at 706, where three OR gates each receive a common input Int. Two 3-input NAND gates may also be a candidate as shown at 708, where the two NAND gates both receive common inputs In2, In3. (Instances where more than two logic gates or more than two common signals are consolidated into a standard cell may enable deletion of more than just one transistor in the standard cell compared to component standard cells for each gate.) Further, logic gate elements of disparate types may be a candidate as shown at 710, where a NAND gate and an AND gate each receive common input signal In2.

Figure 8:
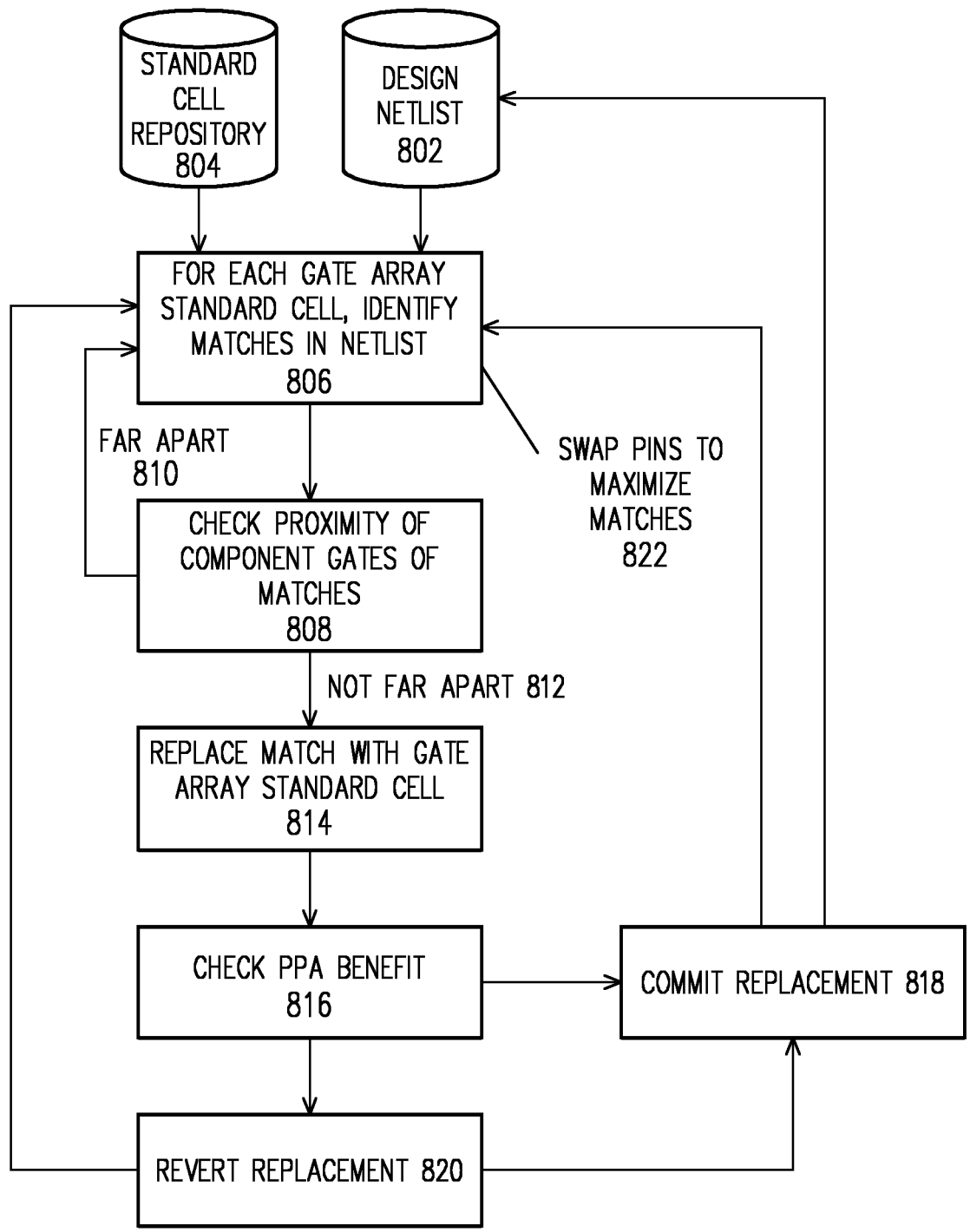
FIG. 8 is a flow diagram depicting an example algorithm for identifying replaceable segments of an integrated circuit design in accordance with embodiments of the disclosure.

FIG. 8 is a flow diagram depicting an example algorithm for identifying replaceable segments of an integrated circuit design in accordance with embodiments of the disclosure. An integrated circuit design is accessed, which in the example of FIG. 8 takes the form of a netlist stored at 802. A standard cell repository 804 is accessed to identify common input gate arrays that may be implemented into the integrated circuit design 802. For each common input gate array available in the repository 804, the integrated circuit design 802 is traversed at 806 to see if there is a portion of the design that matches the logic of the common input gate array. As noted at 822 and described above, inputs of symmetric gates in the design netlist 802 may be modified (e.g., swapped, rotated, or rearranged multiple times for gates having more than 2 inputs) to identify more groups of two or more cells that are candidates for standard cell replacement modifications.

If two cells in the design are identified that match the logic of a common input gate array, an evaluation may, in embodiments, be made at 808 regarding the physical distance between the two cells in the integrated circuit design. When the two cells are relatively close, the improved routing (e.g., using lower level metal layers unavailable for inter-cell routing) and possibility of circuit simplification (e.g., transistor elimination) provided by a standard cell may be worthwhile. If the cells are too far apart (e.g., greater than a threshold distance), then the benefits of a standard cell may not outweigh the cost, such that the modification is abandoned at 810, and a next standard cell replacement candidate is sought at 806. When the cells are not too far apart at 812, a preliminary replacement of the two identified cells with the standard cell is made at 814. A power, performance, area (PPA) check may be made at 816 to confirm that the modification is beneficial to the integrated circuit design. For example, the modified circuit may be evaluated to determine whether any timing failures are present based on the replacement (e.g., a standard cell replacement may in some instances degrade timing, but many times such degradation is not significant enough to cause a timing failure, such that routing and transistor-count benefits outweigh a minor timing degradation). Should PPA benefits be confirmed, the replacement of the design cells with a standard cell is committed at 818, with a corresponding update to the design netlist 802, and a next candidate for replacement is sought at 806. If the standard cell replacement does not have a PPA benefit (e.g., if the replacement results in a timing failure), then the circuit modification is reverted at 820 and a next candidate for replacement is sought at 806.

Figure 9:
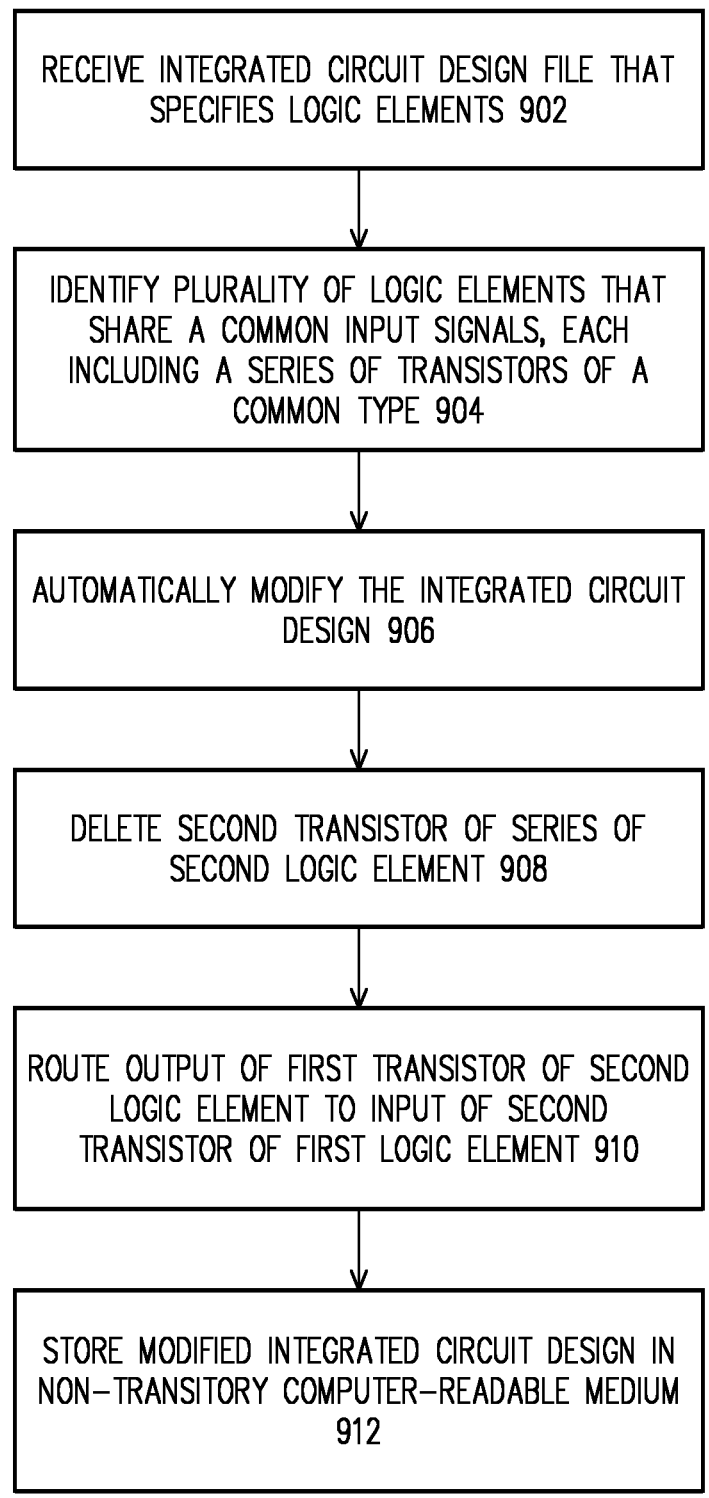
FIG. 9 is a flow diagram depicting a method of automating design of an integrated circuit in accordance with embodiments.

FIG. 9 is a flow diagram depicting a method of automating design of an integrated circuit in accordance with embodiments. An integrated circuit design file is received at 902 that specifies logic elements. At 904, a plurality logic elements are identified that share a common input signal, and a determination is made that the each of plurality of logic elements include a series of transistors (e.g., of a common type, of different types). Upon said determining, the integrated circuit design is modified at 906 by identifying first and second transistors of a series for a first of the logic elements, identifying first and second transistors of a series for a second of the logic elements, deleting a second transistor of the second logic element at 908, and routing an output of the first transistor of the second logic element to an input of the second transistor of the first logic element at 910. At 912, the modified integrated circuit design is stored in a non-transitory computer-readable medium.

Figure 10:
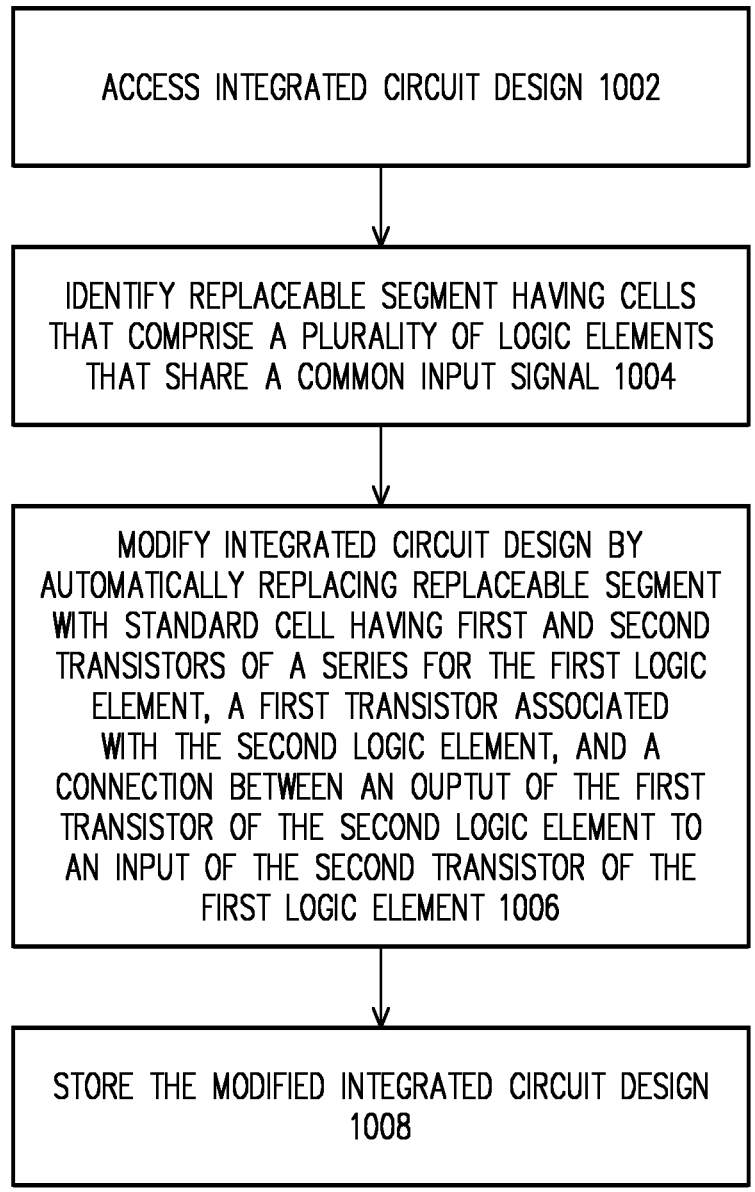
FIG. 10 is a flow diagram depicting a method for optimizing a circuit design in accordance with embodiments.

FIG. 10 is a flow diagram depicting a method for optimizing a circuit design in accordance with embodiments. The method includes accessing an integrated circuit design at 1002. A replaceable segment of the integrated circuit design is identified at 1004 having cells that include a plurality of logic elements that share a common input signal, wherein each of the plurality of logic elements include a series of transistors. The integrated circuit design is modified at 1006 by automatically replacing components of the replaceable segment with a standard cell that comprises first and second transistors of a series for a first of the logic elements; a first transistor associated with a second of the logic elements; and a connection between an output of the first transistor of the second logic element to an input of the second transistor of the first logic element. The modified integrated circuit design is stored at 1008 in a non-transitory computer-readable medium.

Figure 11A:
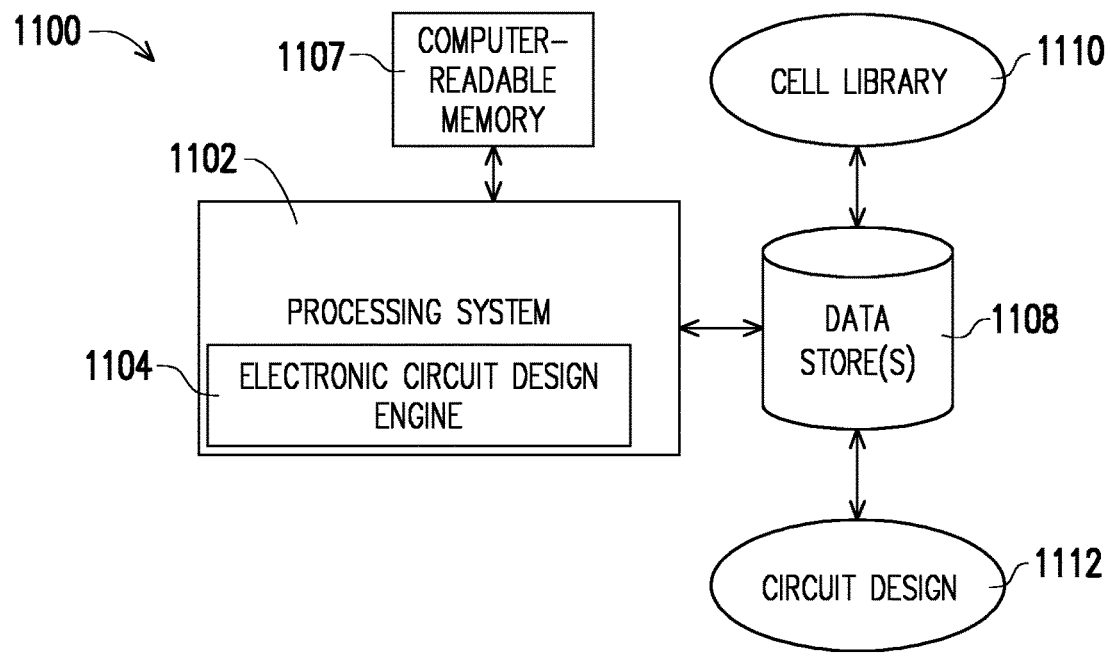
FIGS. 11A, 11B, and 11C depict example systems for implementing the approaches described herein for designing integrated circuits in embodiments.
Figure 11B:
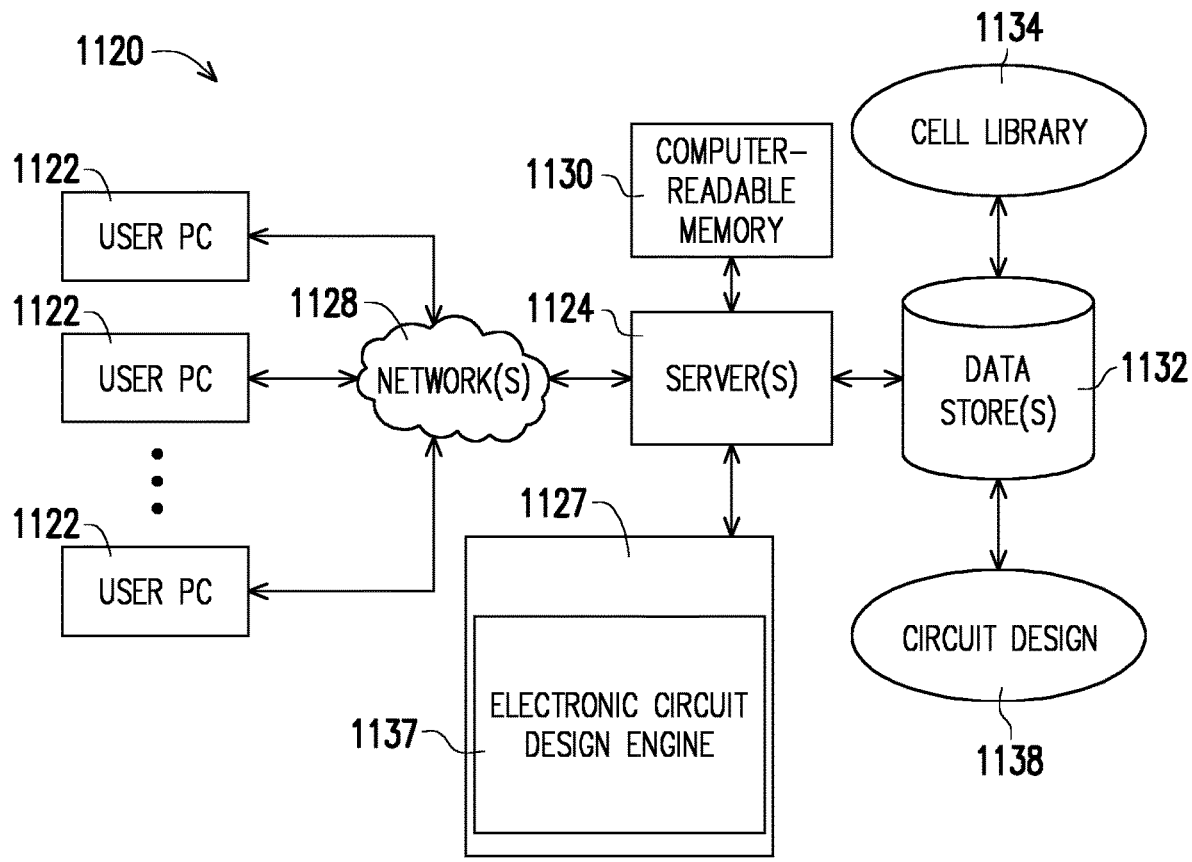
Figure 11C:
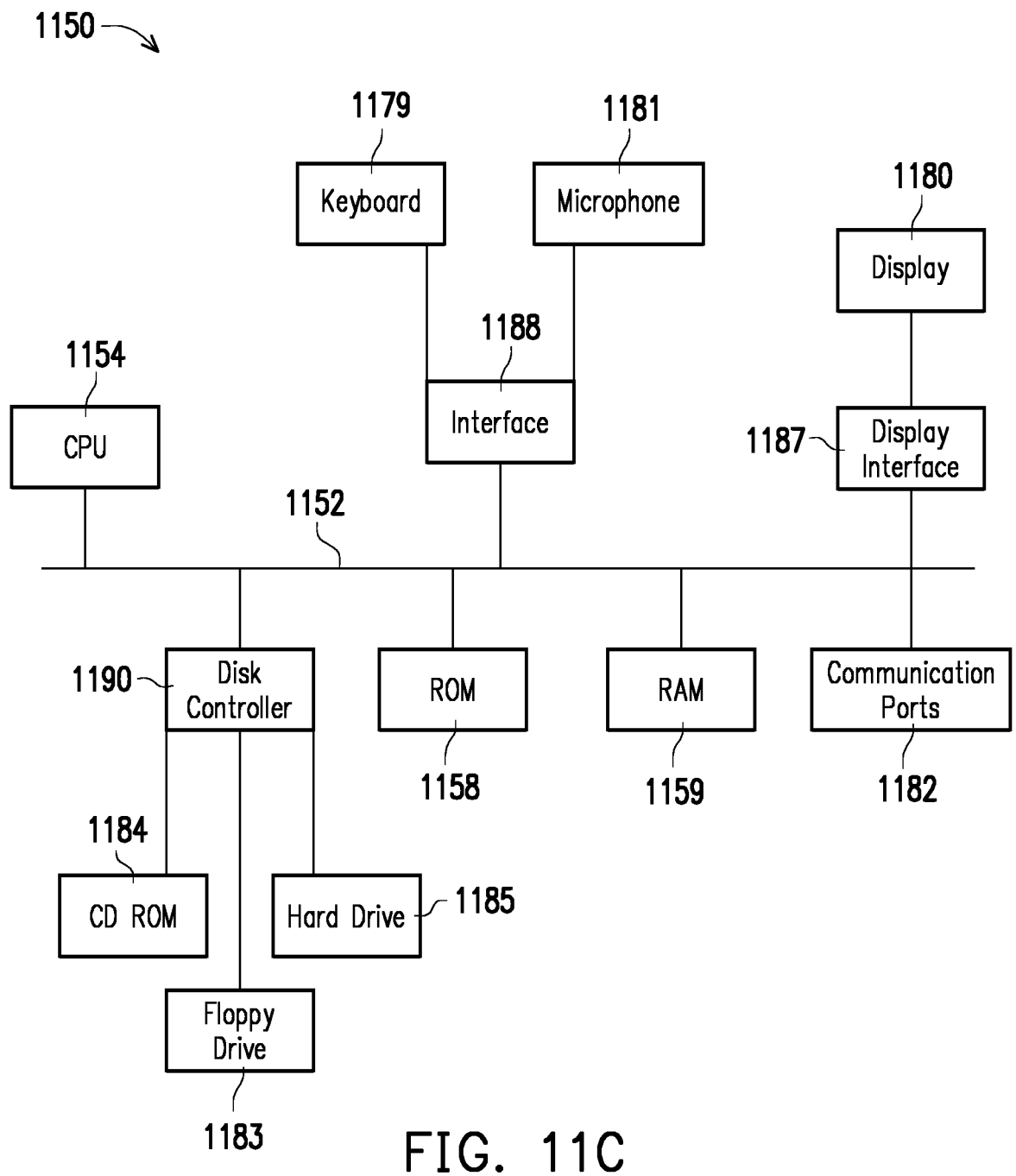

FIGS. 11A, 11B, and 11C depict example systems for implementing the approaches described herein for designing integrated circuits. For example, FIG. 11A depicts an exemplary system 1100 that includes a standalone computer architecture where a processing system 1102 (e.g., one or more computer processors located in a given computer or in multiple computers that may be separate and distinct from one another) includes a computer-implemented electronic circuit design engine 1104 being executed on the processing system 1102. The processing system 1102 has access to a computer-readable memory 1107 in addition to one or more data stores 1108. The one or more data stores 1108 may include a cell library database 1110 as well as a circuit design database 1112. The processing system 1102 may be a distributed parallel computing environment, which may be used to handle very large-scale data sets.

FIG. 11B depicts a system 1120 that includes a client-server architecture. One or more user PCs 1122 access one or more servers 1124 running an electronic circuit design engine 1137 on a processing system 1127 via one or more networks 1128. The one or more servers 1124 may access a computer-readable memory 1130 as well as one or more data stores 1132. The one or more data stores 1132 may include a cell library database 1134 as well as a circuit design database 1138.

FIG. 11C shows a block diagram of exemplary hardware for a standalone computer architecture 1150, such as the architecture depicted in FIG. 11A that may be used to include and/or implement the program instructions of system embodiments of the present disclosure. A bus 1152 may serve as the information highway interconnecting the other illustrated components of the hardware. A processing system 1154 labeled CPU (central processing unit) (e.g., one or more computer processors at a given computer or at multiple computers), may perform calculations and logic operations required to execute a program. A non-transitory processor-readable storage medium, such as read only memory (ROM) 1158 and random access memory (RAM) 1159, may be in communication with the processing system 1154 and may include one or more programming instructions for performing the method of designing an integrated circuit. Optionally, program instructions may be stored on a non-transitory computer-readable storage medium such as a magnetic disk, optical disk, recordable memory device, flash memory, or other physical storage medium.

In FIGS. 11A, 11B, and 11C, computer readable memories 1107, 1130, 1158, 1159 or data stores 1108, 1132, 1183, 1184, 1188 may include one or more data structures for storing and associating various data used in the example systems for designing an integrated circuit. For example, a data structure stored in any of the aforementioned locations may be used to store data from XML files, initial parameters, and/or data for other variables described herein. A disk controller 1190 interfaces one or more optional disk drives to the system bus 1152. These disk drives may be external or internal floppy disk drives such as 1183, external or internal CD-ROM, CD-R, CD-RW or DVD drives such as 1184, or external or internal hard drives 1185. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1190, the ROM 1158 and/or the RAM 1159. The processor 1154 may access one or more components as required. A display interface 1187 may permit information from the bus 1152 to be displayed on a display 1180 in audio, graphic, or alpha-numeric format. Communication with external devices may optionally occur using various communication ports 1182. In addition to these computer-type components, the hardware may also include data input devices, such as a keyboard 1179, or other input device 1181, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

According to some embodiments, a method of automating design of an integrated circuit is provided. An integrated circuit design file is received that specifies logic elements. A plurality logic elements are identified that share a common input signal. A determination is made that the each of plurality of logic elements include a series of transistors. Upon said determining, the integrated circuit design is modified by identifying first and second transistors of a series for a first of the logic elements, identifying first and second transistors of a series for a second of the logic elements, deleting a second transistor of the second logic element, and routing an output of the first transistor of the second logic element to an input of the second transistor of the first logic element. The modified integrated circuit design is stored in a non-transitory computer-readable medium.

In embodiments, a computer-readable medium is encoded with a cell library containing data associated with a plurality of standard cells for performing electronic design automation. The cell library includes a standard cell data record. The standard cell data record includes a logic definition that includes a plurality of logic gates, the plurality of logic gates sharing a common input signal. The standard cell data record also contains a physical definition including identification of a plurality of transistors for implementing a cell associated with the standard cell data record and routing among the plurality of transistors, the physical definition includes first and second transistors of a series for a first of the logic gates and a first transistor for a second of the logic gates, wherein an output of the first transistor of the second logic gate is routed to an input of the second transistor of the first logic gate.

In a further embodiment, a method for optimizing a circuit design includes accessing an integrated circuit design. A replaceable segment of the integrated circuit design is identified having cells that include a plurality of logic elements that share a common input signal, wherein each of the plurality of logic elements include a series of transistors. The integrated circuit design is modified by automatically replacing components of the replaceable segment with a standard cell that comprises first and second transistors of a series for a first of the logic elements; a first transistor associated with a second of the logic elements; and a connection between an output of the first transistor of the second logic element to an input of the second transistor of the first logic element. The modified integrated circuit design is stored in a non-transitory computer-readable medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of automating design of an integrated circuit, comprising, comprising:
   receiving an integrated circuit design file that specifies logic elements;
   identifying a plurality logic elements that share a common input signal;
   determining that the each of plurality of logic elements include a series of transistors;
   upon said determining, automatically modifying the integrated circuit design by:
      identifying first and second transistors for a first logic element of the logic elements;
      identifying first and second transistors for a second logic element of the logic elements;
      deleting the second transistor of the second logic element; and
      routing an output of the first transistor of the second logic element to an input of the second transistor of the first logic element; and
   storing the modified integrated circuit design in a non-transitory computer-readable medium.

2. The method of claim 1, wherein a physical integrated circuit is fabricated based on the modified integrated circuit design.

3. The method of claim 1, wherein, prior to said modifying:
   the second transistor of the second logic element and the second transistor of the first logic element were controlled by the common input signal.

4. The method of claim 1, wherein the first logic element and the second logic element are of the same type.

5. The method of claim 4, wherein the logic elements are AND, OR, XOR, NAND, XOR, or MUX gates.

6. The method of claim 1, wherein the first logic element and the second logic element are of different types.

7. The method of claim 1, wherein the series of transistors are all N-type transistors or all P-type transistors.

8. The method of claim 1, wherein said modifying further comprises:
   determining that a circuit alert condition is present in the specification of the integrated circuit;
   wherein said modifying is inhibited when the circuit alert condition is not rectified.

9. The method of claim 8, wherein an alert condition is determined when the common input signal controls the first transistor of the first or second logic element, wherein that first transistor is connected to an output node of its corresponding logic element.

10. The method of claim 9, wherein the method attempts to rectify the alert condition by switching inputs of the corresponding logic element.

11. The method of claim 8, wherein the alert condition is present when the second logic element is more than a threshold distance away from the first logic element in the integrated circuit design.

12. The method of claim 1, further comprising:
   determining whether the modification results in a timing failure;
   wherein the modification is reverted when the modification is determined to result in a timing failure;
   determining whether the modification results in a power, performance, or area improvement;
   wherein the modification is reverted when no power, performance, or area improvement is determined.

13. A method for optimizing a circuit design, comprising:
   accessing an integrated circuit design;
   identifying a replaceable segment of the integrated circuit design having cells that comprise a plurality of logic elements that share a common input signal, wherein each of the plurality of logic elements include a series of transistors;
   modifying the integrated circuit design by automatically replacing components of the replaceable segment with a standard cell that comprises:
      first and second transistors of a series for a first of the logic elements;
      a first transistor associated with a second of the logic elements;
      a connection between an output of the first transistor of the second logic element to an input of the second transistor of the first logic element; and
   storing the modified integrated circuit design in a non-transitory computer-readable medium.

14. The method of claim 13, further comprising synthesizing the integrated circuit, wherein synthesizing comprises:
   routing an input signal for each distinct input to the plurality of logic elements from upstream cells to the standard cell, including a particular upstream cell associated with the common input signal; and
   routing output signals from the plurality of logic elements to downstream cells.

15. The method of claim 14, wherein synthesizing includes routing only a single signal from the particular upstream cell to the standard cell.

16. The method of claim 13, wherein the replaceable segment comprises a plurality of standard cells, wherein said replacing reduces a total number of standard cells of the circuit design.

17. The method of claim 13, wherein the first logic element and the second logic element share multiple input signals.

18. A non-transitory computer-readable medium having stored thereon software instructions that, when executed by a processor, cause the processor to execute steps for automating design of an integrated circuit comprising:
   receiving an integrated circuit design file that specifies logic elements;
   identifying a plurality logic elements that share a common input signal;
   determining that the each of plurality of logic elements include a series of transistors;
   upon said determining, automatically modifying the integrated circuit design by:
      identifying first and second transistors for a first logic element of the logic elements;
      identifying first and second transistors for a second logic element of the logic elements;
      deleting the second transistor of the second logic element; and
      routing an output of the first transistor of the second logic element to an input of the second transistor of the first logic element; and
   storing the modified integrated circuit design in a non-transitory computer-readable medium.

19. The non-transitory computer-readable medium of claim 18, wherein, prior to said modifying:
   the second transistor of the second logic element and the second transistor of the first logic element were controlled by the common input signal.

20. The non-transitory computer-readable medium of claim 18, wherein said modifying further comprises:

determining that a circuit alert condition is present in the specification of the integrated circuit;

wherein said modifying is inhibited when the circuit alert condition is not rectified.

\* \* \* \* \*